United States Patent [19]

Beyerle

[11] 4,159,770

[45] Jul. 3, 1979

[54] RETAINING DEVICE FOR PLUG-IN UNIT COACTING WITH A CONTACT CARRIER

[76] Inventor: Willi Beyerle, Rur/Düssel-Strasse, 4044 Kaarst, Neuss, Fed. Rep. of Germany

[21] Appl. No.: 845,676

[22] Filed: Oct. 26, 1977

[30] Foreign Application Priority Data

Oct. 27, 1976 [DE] Fed. Rep. of Germany ....... 2648661

[51] Int. Cl.² ...................... B65D 69/00; B65D 85/54
[52] U.S. Cl. ................................................. 206/577
[58] Field of Search ................................. 206/577, 576

[56] References Cited

U.S. PATENT DOCUMENTS

| 3,232,420 | 2/1966 | Haenle | 206/577 |
|---|---|---|---|
| 3,772,573 | 11/1973 | Triplett | 206/328 |
| 3,846,740 | 11/1974 | Damon | 206/328 |
| 3,869,563 | 3/1975 | Orken | 206/328 |
| 3,892,312 | 7/1975 | Tems | 206/328 |

Primary Examiner—Herbert F. Ross
Attorney, Agent, or Firm—Karl F. Ross

[57] ABSTRACT

A kit for building a retaining device with guide rails for the support of a contact carrier, engageable by a coacting plug-in unit, includes a pair of corner connectors molded integrally with the guide rails as part of an assembly whose elements are initially interconnected by a runner structure. The connectors, designed to engage the plug-in unit, are joined to the extremities of the associated guide rails by rupturable links facilitating their detachment. One connector is divided into a male and female part which are interconnected by a flexible link adapted to be looped about a handle of wire leads, emanating from the plug-in unit, when these two parts are snap-fitted together to engage that unit. Coupling formations on the runner structure enable the attachment of several identical assemblies to one another.

19 Claims, 12 Drawing Figures

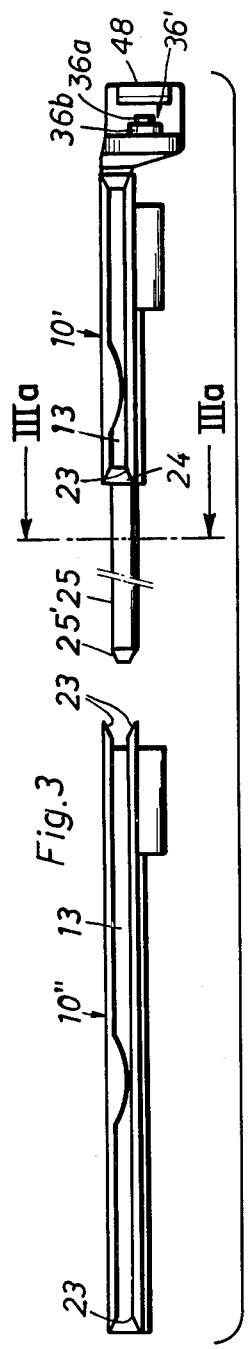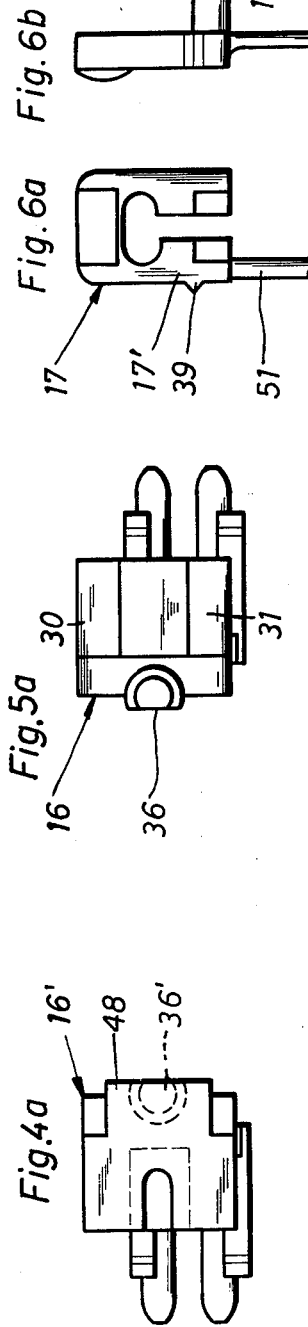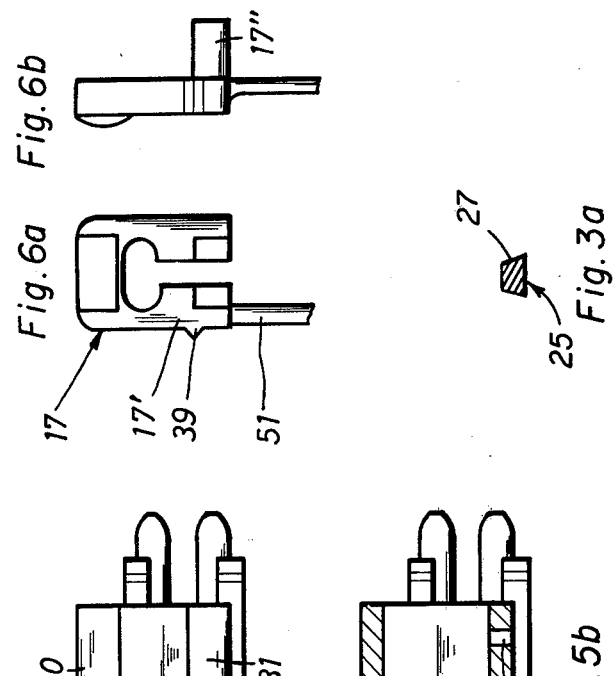

RETAINING DEVICE FOR PLUG-IN UNIT COACTING WITH A CONTACT CARRIER

FIELD OF THE INVENTION

My present invention relates to a retaining device for contact carriers such as printed circuit boards and a coacting plug-in unit having a bundle of wire leads emanating therefrom, the retaining device comprising at least two guide members adapted to be secured to a support for the electromechanical equipment of which the contact carriers and the plug-in unit form part.

DESCRIPTION OF THE PRIOR ART

A conventional device of this type, serving for the holding of socket strips in multiple-rack arrangements for the electronics industry, includes a guide frame consisting of guide strips which are connected to one another by cross-pieces and which have transversely arranged guide grooves. Angle brackets and corner connectors are also provided which on the one hand can be secured by means of a screw connection to one end of a socket strip, or a plug-in unit, and which on the other hand are releasably clamped to the guide frame by means of a latch connection. The guide frames, made of plastic material, are manufactured with but limited dimensional accuracy. It is to be noted that the permissible tolerance of the guide grooves is only a few millimeters and that inaccuracies in the guide grooves can therefore very easily lead to an improper fit between plugs and sockets upon insertion of the printed-circuit boards, with the result that difficulties in making the connections arise and damage can occur. Apart from this, the corner connector is a component which is expensive to manufacture because it requires the use of a special injection mold. Moreover, each socket strip requires two corner connectors for the assembly of the socket strip on the guide frame. These connectors, therefore, have to be appropriately sorted and secured in each individual case to the plug-in unit by means of relatively complicated screw connections. In the event of loss of individual pieces, or in the case of faulty components, delays in putting together the assembly can easily arise.

It is also known to arrange guide rails in pairs on supports for electromechanical equipment and to use fixed, longitudinally extending fastening strips for the securing of sockets for several plug-in units. Even here problems of sorting and adjustment arise which can lead to difficulties in putting the holding device together.

OBJECT OF THE INVENTION

The object of my present invention is to provide a set of molded elements adapted to serve as a kit for building a retaining device of the above-discussed type which can be easily assembled and put into operation.

SUMMARY OF THE INVENTION

In accordance with my present invention, a kit for building such a retaining device comprises a runner structure detachably interconnecting an assembly of integrally molded elements, the latter including a pair of elongate guide members each having an extremity attached to a respective connector which is engageable with an end of a plug-in unit. At least one of these connectors is divided into a male part and a female part, matingly engageable with each other with a snap fit, which are interconnected by a flexible link forming a loop adapted to embrace a bundle of wire leads emanating from the plug-in unit when the two parts are thus engaged.

The plug-in unit can thus be held by the connectors in a position spanning the two guide members which are preferably rail-shaped and form part of a support for one or more contact carriers coacting with that unit.

Advantageously, each guide member is divided into two portions fitting together in end-to-end relationship, each of these portions being connected with a separate arm of the runner structure prior to detachment therefrom. The elements of the assembly may further include extensions of these guide members optionally insertable between the aforementioned portions thereof for effectively lengthening same.

When the plug-in unit has bifurcated ends, the connectors may be provided with stepped dowel pins receivable in their bifurcations. The elements of the assembly may than further include a pair of spacers each emplaceable, after separation from the runner structure, on a step of a respective dowel pin for solidifying the connection.

The kit according to my invention could be shipped with its runner structure intact, though of course the individual elements thereof could also be detached and packaged for shipment prior to final assembly.

BRIEF DESCRIPTION OF THE DRAWING

These and other features of my invention will be described hereinafter in detail with reference to the accompanying drawing in which:

FIG. 1a is an enlarged view of a detail encompassed by a circle 1a in FIG. 1;

FIG. 1b is a side view of the same detail taken in the direction of an arrow 1b in FIG. 1a;

FIG. 3 is a plan view of the lower guide rail of FIG. 2, but with one of the rail parts rotated through 180°;

FIG. 3a is a cross-sectional view taken on the line IIIa —IIIa of FIG. 3;

FIGS. 4a and 5a are front views of two types of holder for a plug-in unit;

FIGS. 4b and 5b are sectional views of the holders shown in FIGS. 4a and 4b, respectively; and FIGS. 6a and 6b are front and side views of a resilient snap lock for the holder shown in FIGS. 5a and 5b.

DESCRIPTION OF THE PREFERRED EMBODIMENT

Figure 1:
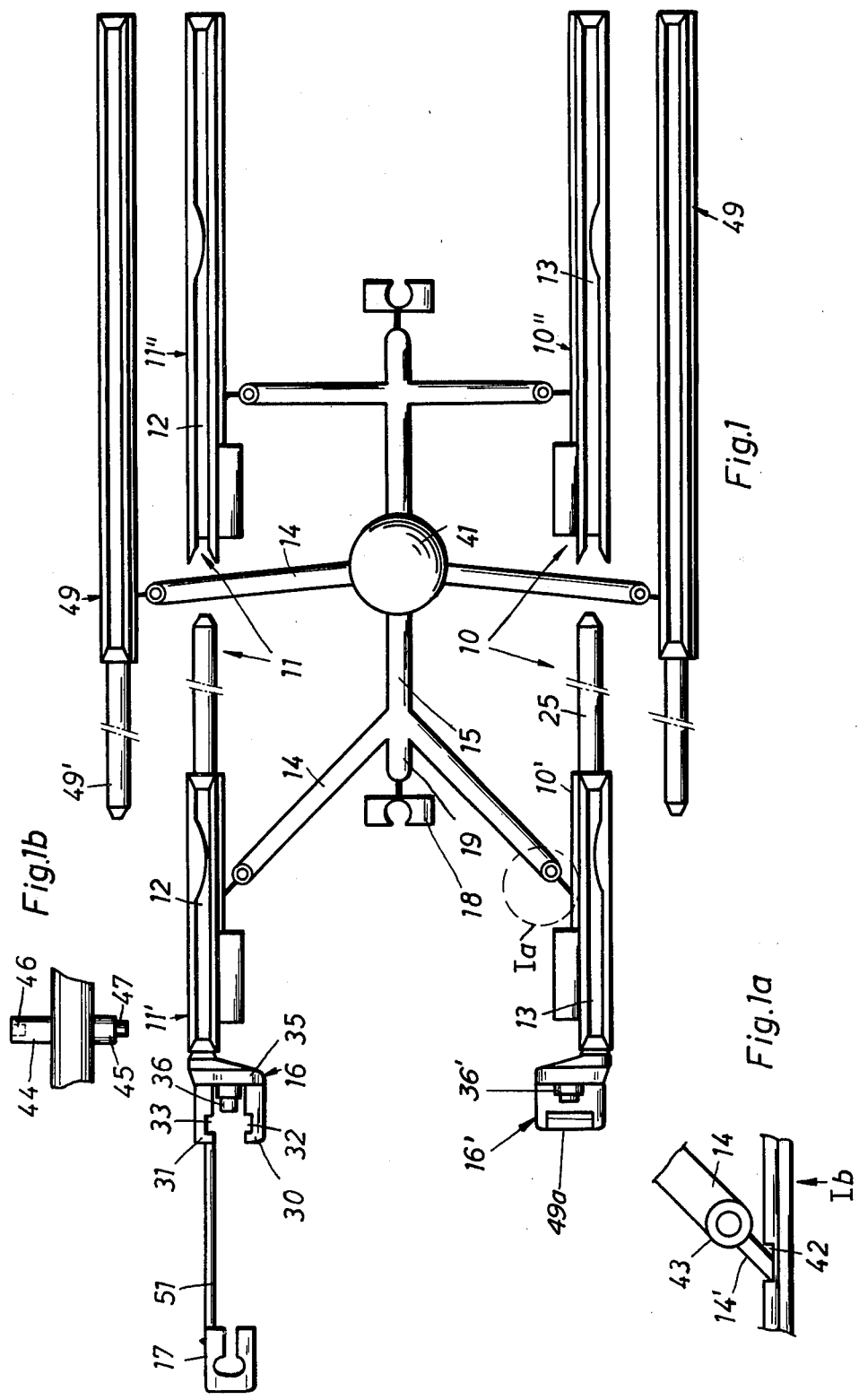
FIG. 1 is a plan view of a kit of separable, integrally molded elements comprising two guide rails, two corner connectors, two link members and two spacer members.

FIG. 1 shows an assembly of integrally molded elements which are separately detachable from a branched runner structure. The molded elements include a pair of guide rails 10 and 11, each of which is formed in two parts and is provided with guide grooves 13 and 12 respectively. The rail parts 10', 10" and 11', 11" are connected to different runners 14 branching off a pair of stems 15 which extend from a central slug 41. The upper guide rail 11 (as viewed in FIG. 1) has at one end a corner connector comprising a female part or plug holder 16 and a resilient male part designed as a snap-type spring clip 17, the corner connector being arranged to grip the plug-in unit 37 shown in FIG. 2. A corresponding lower plug holder 16' at the end of the other rail 10 does not have a snap lock. The assembly shown in FIG. 1 also includes spacer members 18 which are connected to the central stems 15 by short webs 19. The slug 41 represents the point from which the injection-molding operation is carried out.

The runners 14 join the guide rails at countersunk connections, as shown in FIG. 1a. Frangible webs 14' extend into recesses 42 provided in the rails so as not to leave any outwardly projecting runner fragments after their rupture.

As further shown in FIG. 1a, coupling formations 43 are provided at the ends of the runners 14 to connect a number of assemblies of this type to one another. As shown in FIG. 1b, these coupling formations 43 comprise upwardly and downwardly projecting pins 44, 45, the pin 44 being provided with a blind hole 46 and the pin 45 being provided with a spigot 47 whose shape is complementary to that of hole 46. The spigots and holes are arranged to mate with a press fit or a force fit, so that a secure connection among a number of such assemblies can be achieved.

The several rail portions 10', 10", 11', 11" provided with fastening means for mounting them on supports 20 (FIG. 2) for contact carriers 54 coacting with unit 37, e.g., cassettes or other electromechanical components of high-fidelity systems. Each fastening means consists of a guide pin 21 flanked by two barbed resilient tongues 22 which are arranged to snap into engagement behind correspondingly shaped projections (not shown) in the support 20. The rail portions are anchored in position by pushing the fastening means 21, 22 into the supports 20.

The guide grooves 12, 13 of the rail parts 10', 10" are provided at their ends, as shown in FIG. 3, with beveled faces 23 in order to form a convergent entrance to the groove and to make it easier to push in printed-circuit boards to be guided therein, especially with a view to avoiding any tilting of the boards. Correspondingly, the base of the groove is similarly provided with a beveled end face 24.

The rail portions 10', 10" are connected to each other, as shown in FIG. 3, by means of a pin 25 which is provided on the one rail portion 10' and which is telescoped into a socket provided in the other rail portion 10" beneath the guide groove 13. The interconnecting pin 25 is trapezoidal in cross-section, as indicated at 27, as is also the cross-section of the recess in the rail portion 10". Consequently, the two rail portions 10', 10" cannot be rotated relative to one another. In order to facilitate the interfitting of the parts, the pin 25 has a frustoconical end 25'. FIG. 1 shows rail elements 49 which can be fitted as extension members between the rail portions 10', 10" and 11', 11". These extension members 49 have corresponding guide grooves and at their ends are provided with pins 49' and sockets (not shown) into which the pins 25 of the adjacent rail portions 10', 11' can be fitted.

One member 20 is designed to support both the extremity 28 of the rail portion 10' and also the plug holder 16' by means of a bearing surface 20' which abuts these parts. This is necessary because the rail portion 10' is connected to the plug holder 16' by way of a rupturable link having a notch or indentation 29 which constitutes a zone of weakness. The notch 29 is provided in the connecting region in the upper and in the two side surfaces of the rail portion 10'. If the corner connector represented by holder 16' is to be removed as unwanted, then it is broken off downwards before the fitting of the guide rail to the support 20. The same applies to the plug holder 16 of the upper guide rail 11. In order to facilitate this detachment, the holders 16, 16' are provided with cavities 26 adjacent to the zones of weakness.

As shown in FIG. 1, the female connector part 16 is bifurcated. The fork arms or prongs 30, 31 have confronting recesses 32, 33 forming a keyway for the insertion of spring clip 17 with a snap fit. On the prong-supporting base 35 of the holder 16 there is provided a dowel pin 36 which, as shown in FIG. 5a, is arranged above the fork arms 30, 31.

The plug holder 16' of the lower guide rail 10 also has a dowel pin 36' which could be rounded at its end. In front of this pin there is located a retaining tongue 48. Moreover, the holder has a cavity 50 which is open in the direction of the adjacent fastener pin 21 to receive a securing nut by means of which a bus bar can be gripped for the supply of electric current to electrical components.

Each dowel pin 36, 36' is formed with a heavier step 36a and a reduced free end 36b, as illustrated for pin 36' in FIG. 3, to accommodate terminal lugs of different thicknesses on a plug-in unit such as the multi-pin plug 37. If the large-diameter step 36b is not needed because the terminal lug of the plug-in unit 37 is relatively thin, then, in order to stabilize the connection, one of the spacer members 18 is fitted onto this step 36b.

The assembly of the plug-in unit 37 to the guide rails 10, 11 then follows. The lower bifurcated terminal lug 31" of the plug 37 is first pushed over the dowel pin 36' and then the plug is pivoted as shown by the arrow A, into the engaged position shown by broken lines. At this point the upper terminal lug 37' of the unit 37 seats itself on the pin 36 of the holder 16. The arrangement of the guide rails must consequently be so designed that any housing parts which may be provided will not prevent such a plug from being so emplaced or detached. By this hinged fitting, or by merely pulling them apart (in which case the lower plug holder must be identical with the upper holder), the best connection between plugs and sockets is realized.

The spring clip 17 shown in FIGS. 6a and 6b is U-shaped and has a projecting detent 39 on the outside of one limb 17' of the U, this detent co-operating with a latching recess 40 in the holder 16. The clip is pushed into the keyway, 32, 33 of the holder 16, into which it can be inserted in the direction of the arrow B in FIG. 2, to take up the position shown in broken lines in FIG. 2. In order to facilitate its emplacement and withdrawal, the clip 17 has finger lugs 17" by means of which the limbs of the U can be pressed together for low-friction insertion and extraction of the key.

Figure 2:
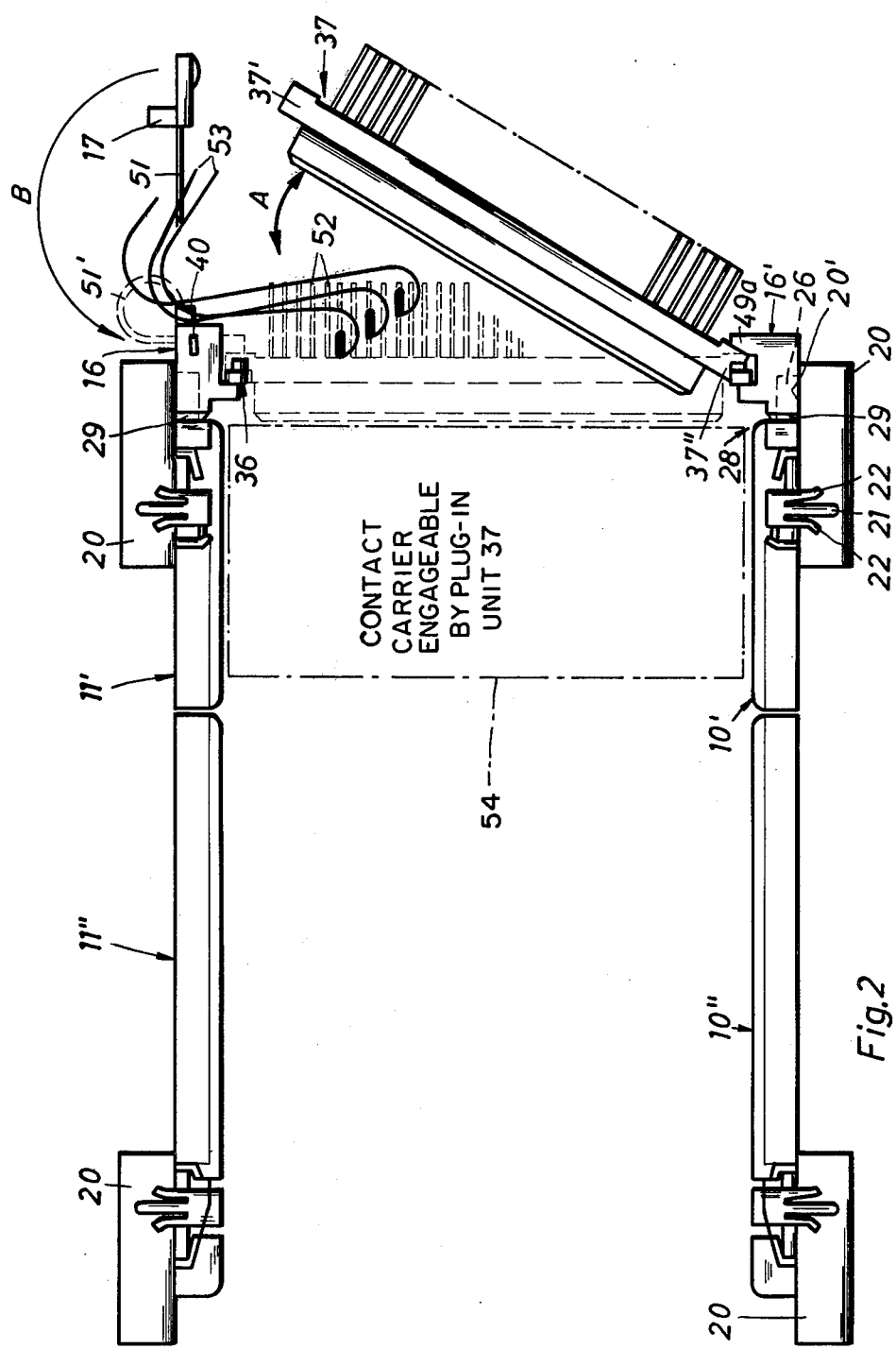
FIG. 2 is a side view of the two guide rails, illustrating their connection with a plug-in unit and supports for electromechanical components.

The spring-clip 17 is connected to the holder 16 by means of a resilient strap 51 which, as shown in FIG. 2, forms a cable-retaining loop 51' after the lock has been pushed into place in the holder. This serves to hold in position the cable or electrical leads 53 which are connected to the conductor pins 52 of plug 37.

I claim:
1. A kit for building a retaining device adapted to hold a contact carrier and a coacting plug-in unit, comprising an assembly of integrally molded elements detachably interconnected by a runner structure, said elements including a pair of elongate guide members and a pair of connectors engageable with respective ends of said plug-in unit, each of said connectors being attached to an extremity of one of said guide members, at least one of said connectors being divided into a male part and a female part matingly engageable with each other and interconnected by a flexible link, said link forming a loop adapted to embrace a bundle of wire leads emanating from said plug-in unit upon a snap-type interfitting of said male and female parts to engage said plug-in unit.

2. A kit as defined in claim 1 wherein each of said connectors is provided with a dowel pin receivable in a bifurcation on the respective end of said plug-in unit.

3. A kit as defined in claim 2 wherein the female part of said one of said connectors has a pair of prongs flanking said dowel pin thereof, said male part being a spring clip insertable in confronting recesses of said prongs just beyond said dowel pin.

4. A kit as defined in claim 2 wherein said dowel pins are stepped and have reduced free ends, said elements further including a pair of spacers each emplaceable on a step of a respective dowel pin upon separation from said runner structure.

5. A kit as defined in claim 3 wherein the other of said connectors has a projection facing the free end of said dowel pin thereof.

6. A kit as defined in claim 1 wherein said connectors are attached to the extremities of their respective guide members via rupturable links.

7. A kit as defined in claim 1 wherein said guide members have recesses within which they are connected with frangible webs forming part of said runner structure for facilitating the separation of said runner structure from said guide members with avoidance of outwardly projecting runner fragments thereon.

8. A kit as defined in claim 1 wherein said runner structure is provided with coupling formations for attaching same to the runner structure of an identical second assembly.

9. A kit as defined in claim 1 wherein each of said guide members is divided into two portions fitting together in end-to-end relationship, each of said portions being connected with a separate arm of said runner structure.

10. A kit as defined in claim 9 wherein said elements further include a pair of guide-member extensions optionally insertable, upon separation from said runner structure, between said portions of each guide member for effectively lengthening same.

11. A kit as defined in claim 10 wherein said portions and said guide-member extensions are provided with telescopically interengageable end pins and sockets.

12. A kit as defined in claim 11 wherein said end pins and sockets have trapezoidal cross-sections.

13. A kit as defined in claim 1 wherein said guide members are grooved rails provided at their extremities with fastening means for securing said rails with their grooves in confronting relationship to a support.

14. In an assembly comprising a pair of molded guide rails for the support of at least one contact carrier and a pair of molded connectors integral with said guide rails, and connectors being engageable with a plug-in unit coacting with said contact carrier and having a bundle of wire leads emanating therefrom, the improvement wherein at least one of said connectors comprises a male part and a female part, one of said parts being rigid with the respective guide rail, the other of said parts being connected with said one of said parts by a flexible link forming a loop adapted to embrace said bundle upon a snap-type interfitting of said male and female parts to engage said plug-in unit.

15. An assembly as defined in claim 14 wherein each of said connectors is provided with a dowel pin receivable in a bifurcation on the respective end of said plug-in-unit, the female part of said one of said connectors having a pair of prongs flanking said dowel pin thereof, said male part being a spring clip insertable in confronting recesses of said prongs just beyond said dowel pin.

16. A kit as defined in claim 15 wherein the other of said connectors has a projection extending past a free end of said dowel pin thereof.

17. An assembly as defined in claim 14 wherein each of said guide rails is divided into a plurality of portions fitting together in end-to-end relationship.

18. An assembly as defined in claim 17 wherein said portions are interfitted by pins and sockets of trapezoidal configuration.

19. An assembly as defined in claim 14 wherein said guide rails are provided with confronting guide grooves have convergent entrance ends.

* * * * *